(12) United States Patent
Morrison et al.

(10) Patent No.: US 12,386,400 B2
(45) Date of Patent: Aug. 12, 2025

(54) INFORMATION HANDLING SYSTEM CABLE BACKPLANE WITH SNAP IN CABLE RETENTION

(71) Applicant: Dell Products L.P., Round Rock, TX (US)

(72) Inventors: John Trevor Morrison, Round Rock, TX (US); Jace W. Files, Round Rock, TX (US); Chiu-Jung Tsen, Zhubei (TW)

(73) Assignee: Dell Products L.P., Round Rock, TX (US)

( * ) Notice: Subject to any disclaimer, the term of this patent is extended or adjusted under 35 U.S.C. 154(b) by 189 days.

(21) Appl. No.: 18/243,907

(22) Filed: Sep. 8, 2023

(65) Prior Publication Data

US 2025/0085750 A1   Mar. 13, 2025

(51) Int. Cl.
*G06F 1/18* (2006.01)
*G06F 1/16* (2006.01)
*H05K 7/14* (2006.01)

(52) U.S. Cl.
CPC ............ *G06F 1/183* (2013.01); *G06F 1/1616* (2013.01); *G06F 1/1686* (2013.01); *H05K 7/1402* (2013.01)

(58) Field of Classification Search
CPC ....................................................... H05K 7/00
See application file for complete search history.

(56) References Cited

U.S. PATENT DOCUMENTS

| | | | |
|---|---|---|---|
| 5,860,015 A | 1/1999 | Olson | |
| 5,966,284 A | 10/1999 | Youn et al. | |
| 6,449,142 B1 | 9/2002 | Wu | |
| 7,567,233 B2 | 7/2009 | Garibaldi et al. | |
| 7,885,866 B2 | 2/2011 | Erickson | |
| 8,422,212 B2 | 4/2013 | Liu et al. | |
| 8,634,873 B2 | 1/2014 | Jones et al. | |
| 8,917,501 B2 | 12/2014 | Hokugou et al. | |
| 9,274,565 B2 | 3/2016 | Tanaka | |
| 9,494,976 B2 | 11/2016 | Bates et al. | |
| 9,507,385 B2 | 11/2016 | Chen et al. | |
| 12,215,531 B1 | 2/2025 | Cheringal | |
| 2004/0012509 A1 | 1/2004 | Chen | |

(Continued)

OTHER PUBLICATIONS

U.S. Appl. No. 18/081,061, filed Dec. 14, 2022, entitled "Information Handling System Keyboard Support With Rail Guide Structure Assembly to a Housing Rail," by inventors John Trevor Morrison et al.

(Continued)

*Primary Examiner* — Jerry Wu

(74) *Attorney, Agent, or Firm* — Zagorin Cave LLP; Robert W. Holland

(57) ABSTRACT

An information handling system motherboard interfaces with other components, such as an I/O board and a display, through a cable backplane having an M.2 edge card connector and coupled to a housing with a snap in cable retainer. The motherboard slides into position at the housing to have an edge card extending past one side to engage into the edge card connector. The cable backplane is a flexible cable that routes through the hinge up lid housing portion of the system to communicate with a display and/or camera in the lid portion, or to route back into the main housing portion to communicate with an I/O board.

9 Claims, 15 Drawing Sheets

(56) References Cited

U.S. PATENT DOCUMENTS

| | | |
|---|---|---|
| 2004/0190239 A1 | 9/2004 | Weng et al. |
| 2005/0184970 A1 | 8/2005 | Wegert et al. |
| 2007/0097079 A1* | 5/2007 | Mundt .................. G06F 3/0213 |
| | | 345/168 |
| 2008/0019085 A1 | 1/2008 | Nakajima |
| 2008/0081505 A1* | 4/2008 | Ou ...................... H04M 1/0237 |
| | | 439/374 |
| 2008/0174458 A1 | 7/2008 | Mundt et al. |
| 2009/0299881 A1 | 12/2009 | Del Rosario et al. |
| 2010/0092196 A1 | 4/2010 | Mimura |
| 2010/0149741 A1 | 6/2010 | Liu |
| 2010/0300159 A1 | 12/2010 | Berg et al. |
| 2013/0222993 A1 | 8/2013 | Iizuka |
| 2013/0286561 A1 | 10/2013 | Hokugou et al. |
| 2013/0308261 A1 | 11/2013 | Matsumoto et al. |
| 2014/0204519 A1 | 7/2014 | Wu |
| 2014/0204520 A1 | 7/2014 | Wu et al. |
| 2014/0355193 A1 | 12/2014 | Purcocks |
| 2015/0138714 A1 | 5/2015 | Davis |
| 2015/0189962 A1 | 7/2015 | Yeo et al. |
| 2016/0011627 A1 | 1/2016 | Lin |
| 2016/0202733 A1 | 7/2016 | Ho |
| 2016/0231788 A1 | 8/2016 | Chen et al. |
| 2019/0094938 A1 | 3/2019 | Tidwell |
| 2019/0095215 A1 | 3/2019 | Teoh |
| 2019/0302852 A1 | 10/2019 | Kitamura et al. |
| 2020/0066692 A1 | 2/2020 | Wolter et al. |
| 2020/0210537 A1 | 7/2020 | Wang |
| 2020/0333852 A1 | 10/2020 | Smith et al. |
| 2020/0348745 A1 | 11/2020 | Hamlin et al. |
| 2021/0063486 A1 | 3/2021 | Rotem |
| 2021/0223825 A1 | 7/2021 | Seiler et al. |
| 2021/0232475 A1 | 7/2021 | Ong |
| 2022/0011829 A1 | 1/2022 | Liang |
| 2022/0114136 A1 | 4/2022 | Zhu |
| 2022/0318154 A1 | 10/2022 | Fuller |
| 2023/0185291 A1 | 6/2023 | Morrison et al. |
| 2023/0281080 A1 | 9/2023 | Wu |
| 2023/0333666 A1 | 10/2023 | Huang |

OTHER PUBLICATIONS

Dell, "Latitude 7490—Dell, Owners Manual," Rev. A04, Aug. 2021 (Year: 2021), 92 pages.

Setterberg, M., "Display Port Link Training Optimization," Thesis in Embedded Electronic System Desing, University of Gothenburg, Sweden 2017 (Year: 2017), 73 pages.

* cited by examiner

INFORMATION HANDLING SYSTEM CABLE BACKPLANE WITH SNAP IN CABLE RETENTION

BACKGROUND OF THE INVENTION

Field of the Invention

The present invention relates in general to the field of portable information handling systems, and more particularly to an information handling system dual pivot hinge signal path.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems generally have a stationary or portable configuration. Stationary configurations include desktop and server systems that typically operate in a fixed location with external power and peripherals. Portable information handling systems integrate processing components, a display and a power source in a portable housing to support mobile operations. Portable information handling systems allow end users to carry a system between meetings, during travel, and between home and office locations so that an end user has access to processing capabilities while mobile. Tablet configurations typically expose a touchscreen display on a planar housing that both outputs information as visual images and accepts inputs as touches. Convertible configurations typically include multiple separate housing portions that couple to each other so that the system converts between closed and open positions. For example, a main housing portion integrates processing components and a keyboard and rotationally couples with hinges to a lid housing portion that integrates a display. In a clamshell configuration, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility. Portable information handling systems also operate with peripheral devices, particularly when the end user is in an office or home environment.

Recently, increased reliance on work from home and improvements in processing, storage and networking capabilities for portable information handling systems have resulted in a greater use of portable information systems for personal and enterprise usage scenarios. Mobile use scenarios can result in greater wear and tear on portable information handling systems with large variances in expected life depending on how and where the systems are used. In some situations, batteries, displays and keyboards integrated in portable information handling systems experience little use, such as when the systems are used with a dock and external peripherals, while in other situations these components are used extensively, such as when the systems are used in mobile scenarios. When a portable information handling system fails due to a component failure, many of the remaining components have substantial useable life. Repairing a portable information handling system by replacing failed components helps to reduce commitment of functional components to landfills, to reduce system costs and to reduce environmental impacts. In some instances, the remaining components have experienced variable use so that the remaining life of the repaired system is uncertain and repairing with new components can be inefficient and cost prohibitive. An alternative is to harvest components from a failed information handling system, test the components for remaining life, and then reuse components where justified. Unfortunately, the expense of breaking down information handling systems, testing the components and rebuilding the information handling systems can often prove prohibitive.

One difficulty with reuse of information handling system components is the tracking of remaining life and predicting of future failures. Another difficulty is tearing down the information handling systems to separate out reusable components and then reassembling the components into refurbished or repaired information handling systems. Although reuse of components seems environmentally friendly on a superficial level, the true environmental cost can include a variety of factors related to the manufacture of the components, operational management of manufacturing activities and transportation logistics. One component that tends to fail in portable information handling systems is the hinge up cable that communicates information from a motherboard in a main housing portion to a display in a lid housing portion. Over time, rotation of the housing portions can kink the cable leading to poor signal transfer that can cause system failure. Robust cable solutions tend to increase system cost and complexity and can still result in failure. Often cable failure is random and unpredictable so that cable reuse is not very practical. Generally, including cables in a system tends to make assembly and disassembly more difficult and increases the carbon footprint associated with the system. In a typical information handling system, multiple cables are included to communicate between the motherboard and the display, input/output boards that support external cable connections, and power.

SUMMARY OF THE INVENTION

Therefore, a need has arisen for a system and method which simplifies hinge up communication from a motherboard to a display.

A further need exists for a system and method that reduces the number of cables included in an information handling system.

A further need exists for a system and method that monitors system operations to detect cable and other component failures.

In accordance with the present invention, a system and method are provided which substantially reduce the disadvantages and problems associated with previous methods and systems for communicating information within an information handling system. A snap in cable retainer couples a cable backplane to an information handling system housing with an edge card connector aligned to engage an edge card coupled to a motherboard that is slid into position. The cable backplane interfaces the motherboard with a display, with hinge up components like a camera, and/or an input/output board having a port and placed in the housing distal the motherboard. As an alternative, a communication link is included in the keyboard membrane to interface the motherboard and an I/O board. Communication link performance is monitored by tracking link training events that indicate cable backplane reliability. Additional tracking of power use during predefined events helps to identify system faults and potential failures in deployed systems that increase power use over time.

More specifically, a portable information handling system processes information with processing components coupled to a motherboard in a portable housing, such as a processor that executes instructions and a memory that stores the instructions and information. The motherboard couples to a main portion of the housing with an edge card extending from one side, such as an M.2 edge card. A snap in cable connector couples to a side of the main portion and holds an edge card connector, such as an M.2 edge card connector, aligned to accept the edge card when the motherboard is slid into position against the housing side. A support area, such as foot portion, of the snap in cable retainer inserts under the motherboard to secure the cable connector in place. A cable backplane extending from the edge card connector communicates information to the lid housing portion where the information can support presentation of visual images at a display and interactions with a camera and other hinge up sensors. In one embodiment, camera and other sensor communications are completed through wirelines formed in the camera along the display periphery and output at contact pads exposed at the display and aligned with spring biased contact pins of the camera module. In one alternative embodiment, the cable backplane routes through a second snap in cable retainer and edge card cable connector to an I/O board that supports one or more cable ports. In another alternative embodiment, a communication link to the I/O board is provided with differential serial wire pairs integrated in a keyboard membrane and communicating through spring biased connectors and connection pads. As the communication links train over time, such as at power up or after a communication fault, the training results and parameters are tracked to help predict future failures of the cable backplane and/or membrane differential serial pair and to provide insights regarding the viability of the communication links for reuse versus recycling. Component power use is also monitored for known events, such as boot, where increases in power use tend to indicate risk of failure of the information handling system and/or isolated portions of the information handling system.

The present invention provides a number of important technical advantages. One example of an important technical advantage is that a portable information handling system assembles with fewer cables and includes system tracking that monitors performance related to the cables to aid with cable reuse and recycling. The reduced number of cables and toolless coupling of the cables at assembly reduce system cost and improve system reliability and robustness. Tracking of the cable performance, such as link training results and power draw changes over time, help to guide decisions on component reuse versus recycling and thereby aid in reducing a carbon footprint associated with information handling system manufacture, distribution and reuse.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system communication link cable backplane interfaces a motherboard and other components, such as a display and input/output (I/O) board, with tracking of communication link reliability. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
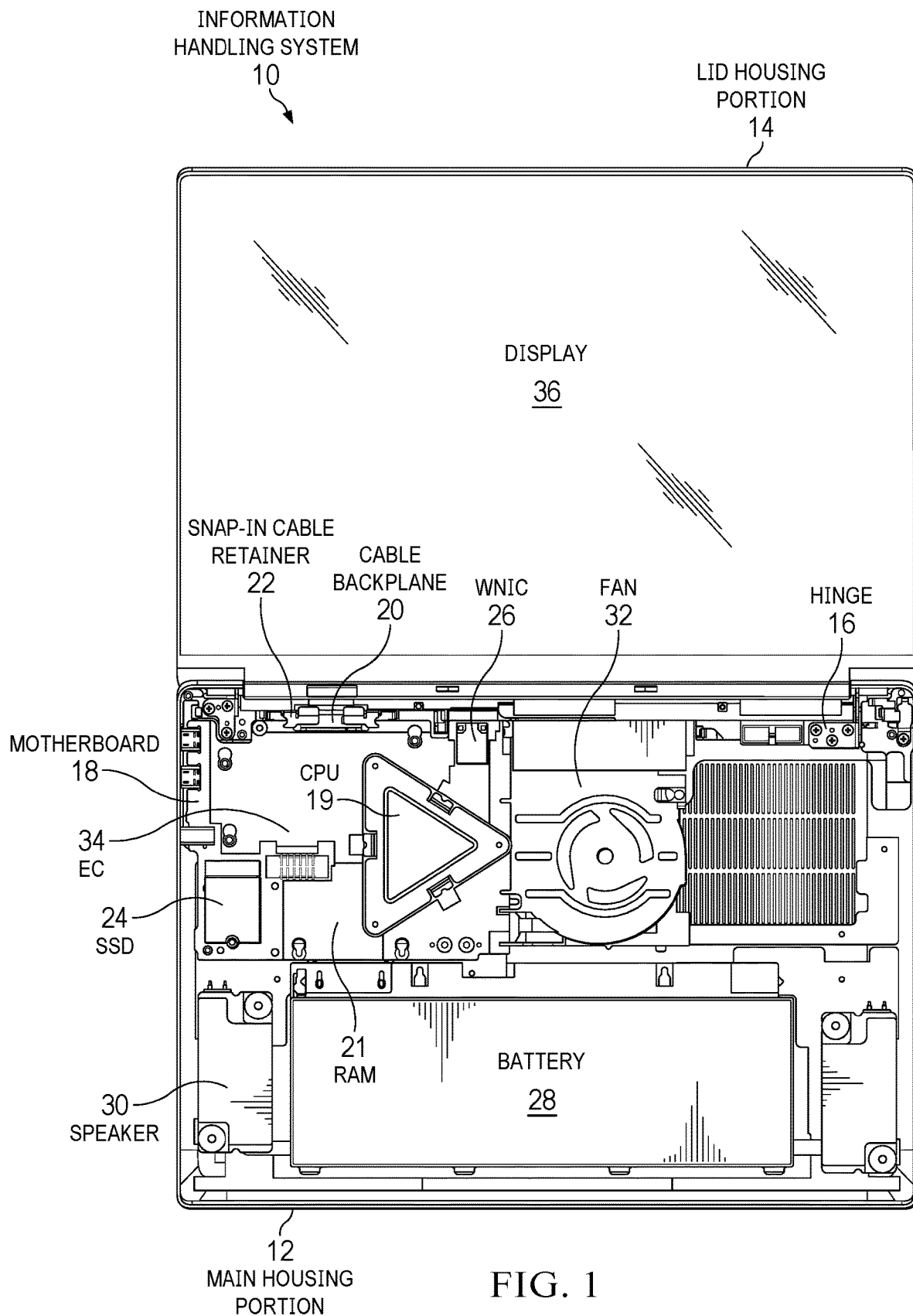
FIG. 1 depicts a portable information handling system that communicates from a motherboard in a main housing portion to components in a lid housing portion through a cable backplane with a snap in cable retainer.

Referring now to FIG. 1, a portable information handling system 10 is depicted that communicates from a motherboard 18 in a main housing portion 12 to components in a lid housing portion 14 through a cable backplane 20 with a snap in cable retainer 22. Information handling system 10 processes information with processing components disposed in main housing portion 12 that communicate through wirelines of motherboard 18. In the example embodiment, a central processing unit (CPU) 19 executes instructions to process information in cooperation with a random access memory (RAM) 21 that stores the information and instructions. A solid state drive (SSD) 24 provides persistent storage during power down, such as with flash integrated circuits. A wireless network interface controller (WNIC) 26 provides wireless signal communications with peripheral devices and networks A battery 28 stores power to run the processing components when external power is not available. Speakers 30 generate audible sounds for audio information. A cooling fan 32 generates an active cooling airflow that cools the processing components. An embedded controller 34 has an associated flash memory and a processing resource that manages operating conditions within the system, such as application of power, internal thermal conditions and interactions with peripheral devices. Lid housing portion 14 rotationally couples to main housing portion 12 by a hinge 16 to rotate between open and closed positions. A display 36 couples to lid housing portion 14 and interfaces with motherboard 18, as described in greater detail below, to present the information as visual images. As an example, portable information handling system 10 has the features described in U.S. patent application Ser. No. 18/081,061, entitled "Information Handling System Keyboard Support with Rail Guide Structure Assembly to a Housing Rail," by Morrison et al., filed on Dec. 14, 2022, and incorporated herein as if fully set forth.

Cable backplane 20 is a flexible printed circuit cable that includes wirelines to communicate information from motherboard 18 to display 36 for presentation as visual images. The flexible printed circuit material flexes during rotation of the housing between open and closed positions to support the mobile housing configuration. Snap in cable retainer 22 couples to an edge card connector that terminates the flexible cable backplane 20 to hold the cable backplane in place relative to an edge card extending from motherboard 18. In the example embodiment, an M.2 edge card connector couples to the end of the flexible cable and fits snugly within snap in cable retainer 22 to a position in alignment with the edge card extending from the motherboard. The M.2 card connector is held in place within a central slot of cable retainer 22, which in turn snaps to a fixture formed in main housing portion 12. The cable and retainer assembly fits together and disassembles without tools to aid manufacture and reuse of systems while also providing a reliable and robust interface. In addition to supporting communication of display information from the motherboard to the display, the cable backplane may support other hinge-up components, such as a camera and sensors coupled in lid housing portion 14. Although the M.2 edge card and connector provide a reliable and robust communication pin interface, other embodiments may use other types of card and card connector interfaces to interface the motherboard and cable at assembly of the motherboard in the main housing portion, as is described below in greater detail.

Figure 2:
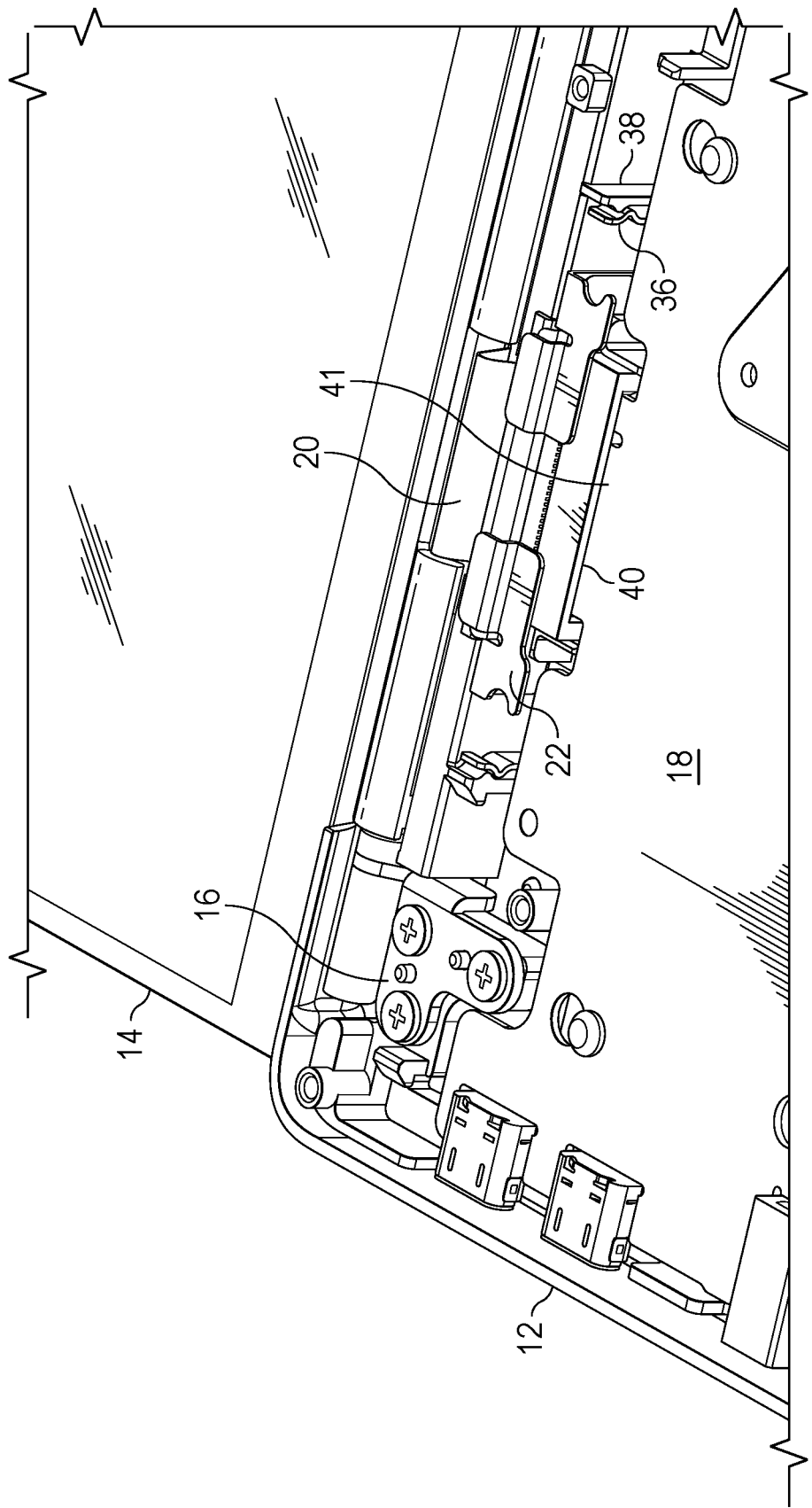
FIG. 2 depicts an upper perspective detailed view of the information handling system having the cable backplane coupled to the main housing portion by the snap in cable retainer.

Referring now to FIG. 2, an upper perspective detailed view of the information handling system depicts cable backplane 20 coupled to main housing portion 12 by snap in cable retainer 22. Cable backplane 20 terminates with an M.2 edge card connector 40 that accepts an edge card 41 coupled to motherboard 18 to align pins and pads of the edge card and edge card connector for a signal interface. Cable backplane 20 has a flexible cable that passes into lid housing portion 14 and up towards a display connector to communicate with the display. When lid housing portion 14 rotates about hinge 16 relative to main housing portion 12, the flexible cable flexes to maintain a signal interface. Snap in cable retainer 22 couples around edge card connector 40 to hold the connector in place relative to edge card 41 and motherboard 18. When the information handling system is assembled, edge card connector 40 is inserted in the central opening of snap in cable retainer 22, which is then snapped into a coupling point of main housing portion 12. In the example embodiment, a dimple 38 formed in main housing portion 12 presses against a vertical member of snap in cable retainer 22 having a dimple cavity 36. Dimple 38 firmly fits in dimple cavity 36 to hold the retainer and cable backplane in position. Once the cable retainer snaps into position and holds the edge card connector aligned to accept the edge card, motherboard 18 is slid into position to insert edge card 41 into edge card connector 40 for a secure and robust signal interface. Motherboard 18 slides into a position over top of a base or foot structure of snap in cable retainer 22 so that the cable retainer is held securely in part by placement of the motherboard.

Figure 3:
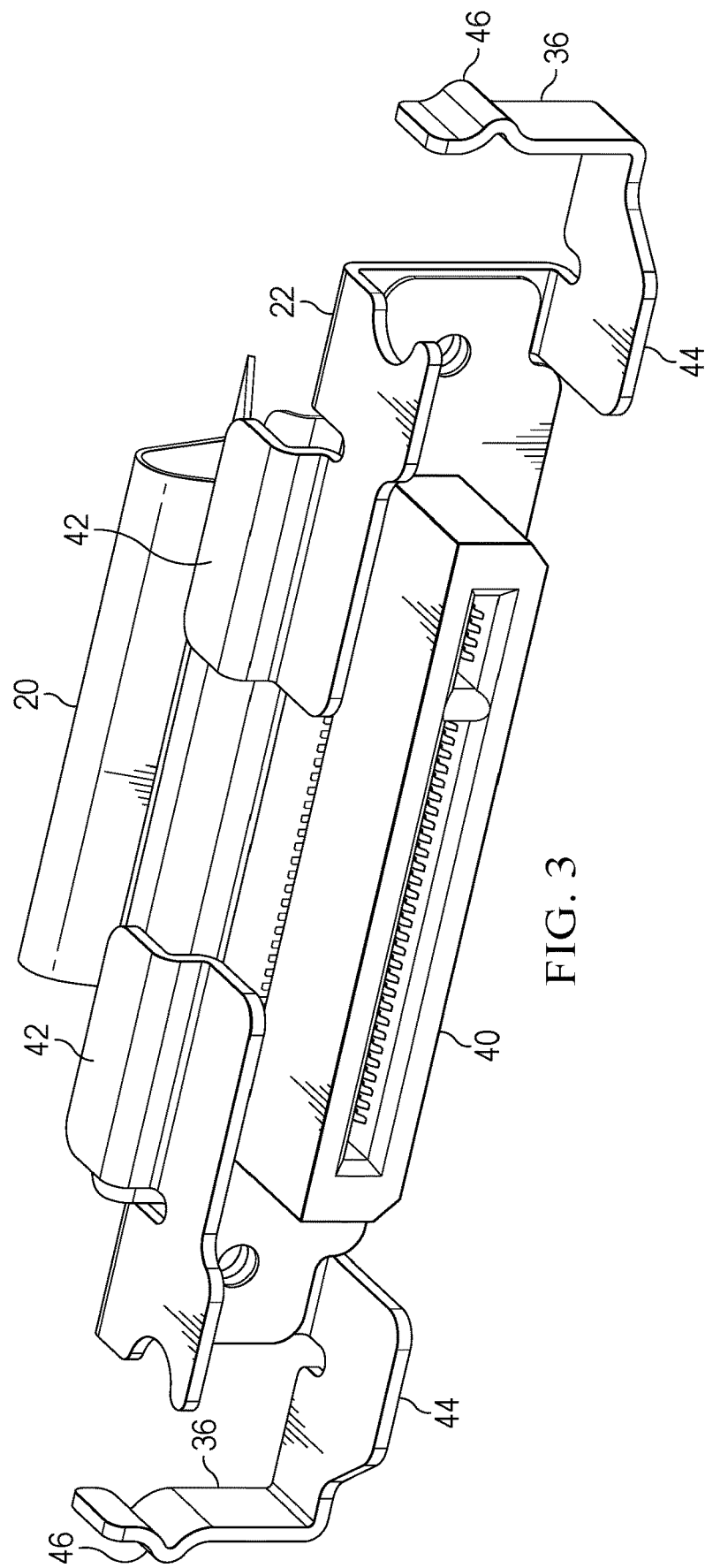
FIG. 3 depicts an upper side perspective view of the snap in cable retainer coupled to the cable backplane and configured to snap into position at a main housing portion.

Referring now to FIG. 3, an upper side perspective view depicts the snap in cable retainer 22 coupled to the cable backplane 20 and configured to snap into position at a main housing portion. Snap in cable connector 22 has a brace portion 42 that defines an opening in which edge card connector 40 fits snuggly and is coupled into a fixed position. In some embodiments, screw openings at opposite sides of the edge card connector accept alignment pins of the brace portion to secure the edge card connector in position. A security portion 44 at the bottom side of the edge card connector extends forward to fit under the motherboard when the motherboard slides the edge card into position. A vertical member 46 extends up from the security portion 44 to have a dimple cavity aligned to fit into a dimple extending from the main housing portion. In the example embodiment, snap in cable retainer 22 is a resilient metal material, such as punched stainless steel. Alternatively, injection molded plastic may be used.

Figure 4:
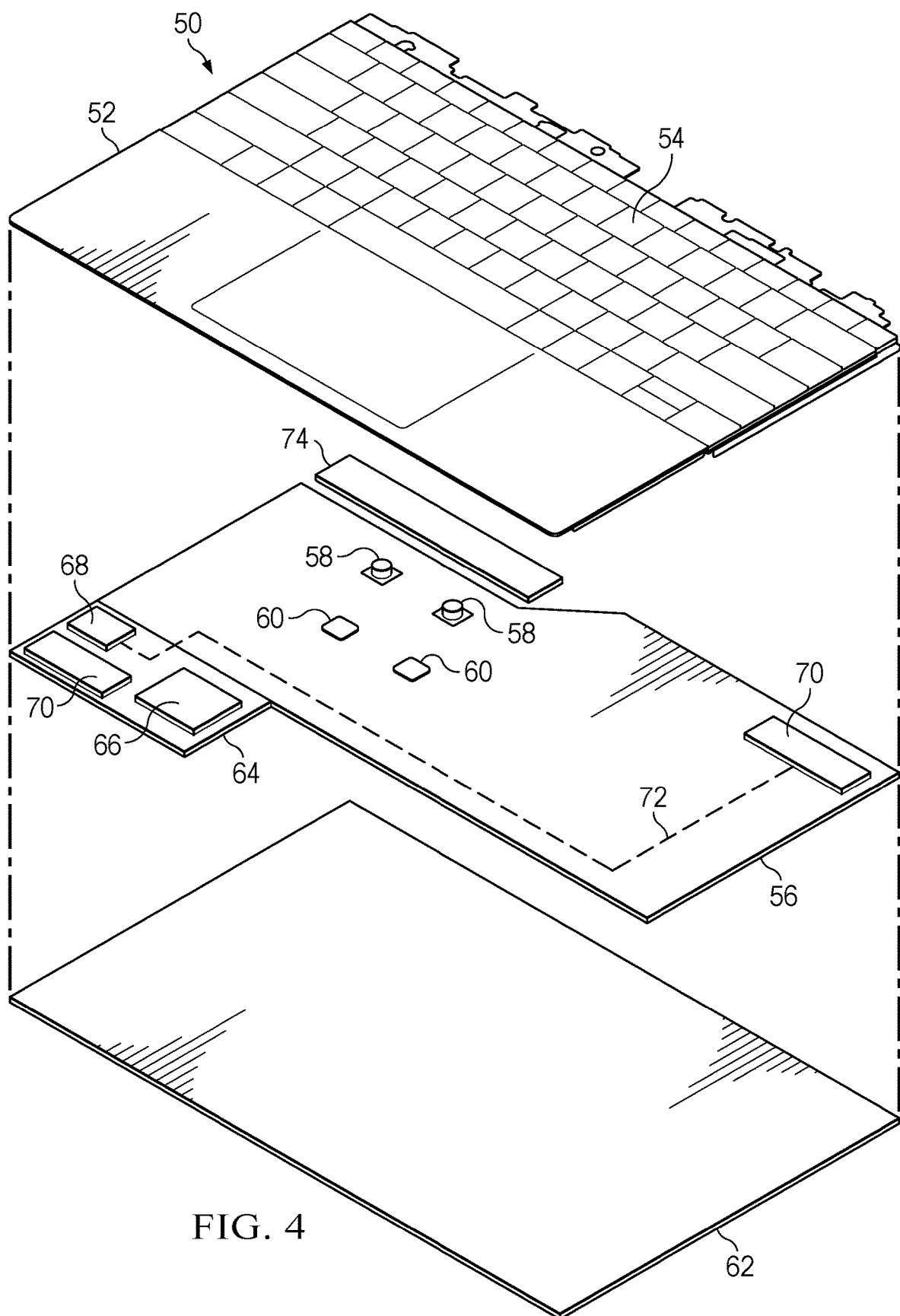
FIG. 4 depicts an upper exploded perspective view of a keyboard having a membrane that includes a high speed communication link between a motherboard and a port.

Referring now to FIG. 4, an upper exploded perspective view depicts a keyboard 50 having a membrane 56 that includes a high speed communication link 72 between a motherboard and a port. In the example embodiment, keyboard 50 couples to a lid housing portion over the main housing portion of the information handling system to protect the processing components and expose keys 54 biased upwards in a keyframe 52. End user presses on keys 54 and are detected by sensors 58 included in membrane 56, such as with a conventional matrix of conductive lines formed in the membrane that close a circuit in response to a press at a sensor. In the example embodiment, membrane 56 includes a control circuit board 64 that interfaces with the matrix so that a controller 66 or similar processing resource can identify the key presses for communication to the motherboard. In the example embodiment, the key values are provided to a high speed link controller 68 and communicated through an arrangement of spring biased connectors 70 and opposing contact pads of the motherboard. For example, link controller 68 is a USB or Thunderbolt high speed communication hub that includes the key input values with other communications as described below. A support plate 62 provides support against which key presses work so that the membrane sensors detect the key press value. In the example embodiment, backlights 60 are included in membrane 56, such as with mini-LEDs, to provide illumination to the keys 54. Alternatively, the backlights may be included in other circuit layers either above or below support plate 62.

An arrangement of spring biased connectors 70 and contact pads on opposing sides of membrane 56 support communications between a motherboard and a port through a high speed communications link 72 included in membrane 56, such as with silver traces in the flexible substrate similar to those of the key matrix. The spring biased connectors, such as pogo pins, may be located at the membrane or at the motherboard and/or port so that the communication link extends across the membrane to interface the motherboard and port. As an example, communications link 72 is a serial differential pair (or other controlled impedance traces) that uses Thunderbolt protocol signals to communicate network, display or other data in a consolidated interface that has the separate data managed on opposing ends of the communications link by a link controller 68. In one alternative configuration, some or all of the communication link traces may be included in a backlight portion of the membrane or separate backlight flexible circuit. A copper ground tape 74 couples directly to a ground of the motherboard, membrane and port circuit board to ensure that an adequate common ground is available to decoding the differential signal. Incorporating high speed signaling through the membrane reduces the need for a separate cable to support a port at the housing side distal the motherboard, thus simplifying system assembly and reducing the number of components of the system. A communications hub, such as Thunderbolt hub, on each of the motherboard, membrane and port circuit board supports a repeater architecture with high speed controlled impedance traces that support multiple input/output ports at the port circuit board, such as those described below.

Figure 5:
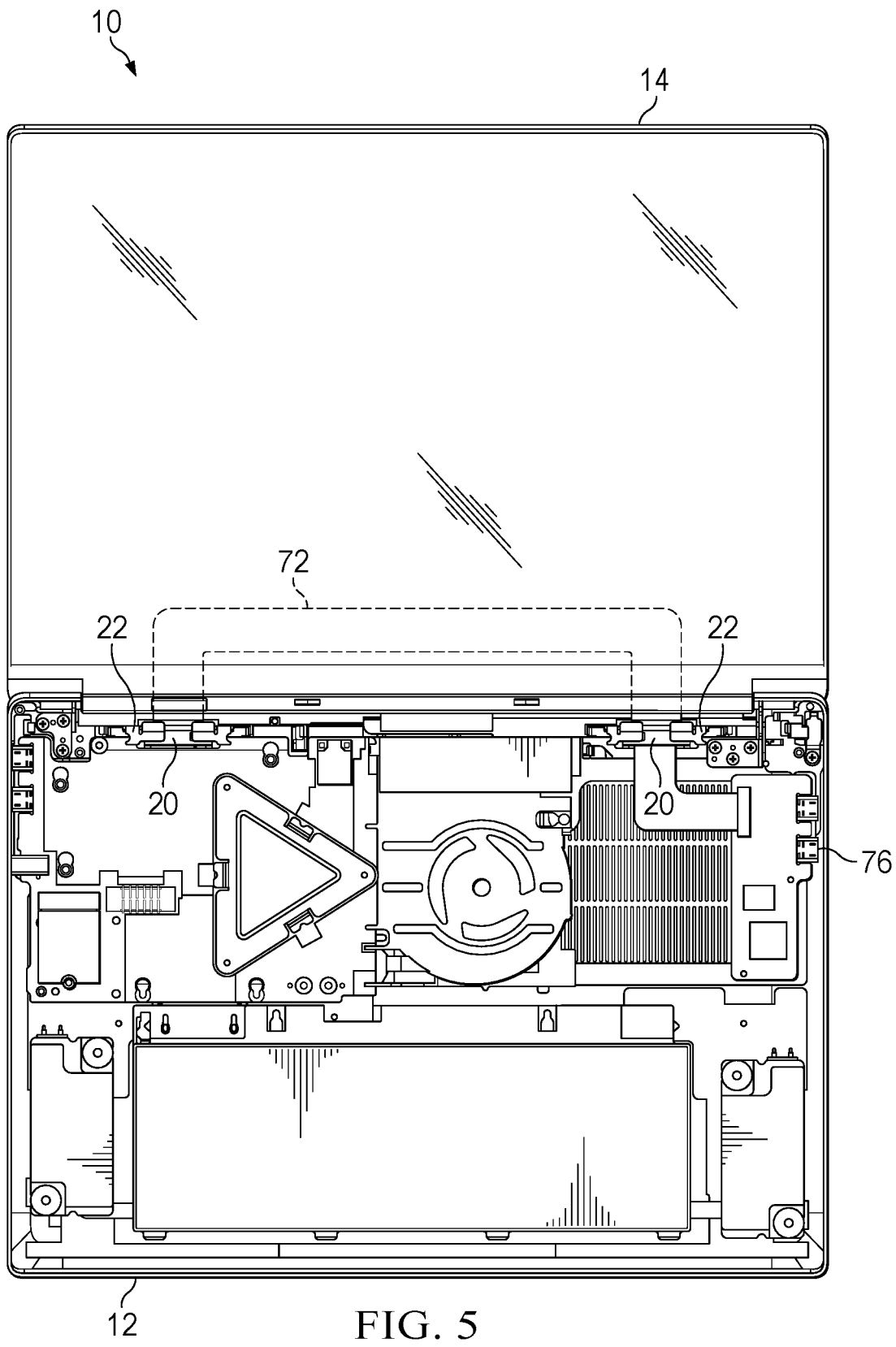
FIG. 5 depicts a top view of an information handling system having an alternative embodiment for communication between a motherboard and a port at an I/O board on a side of the information handling system distal the motherboard.
Figure 9:
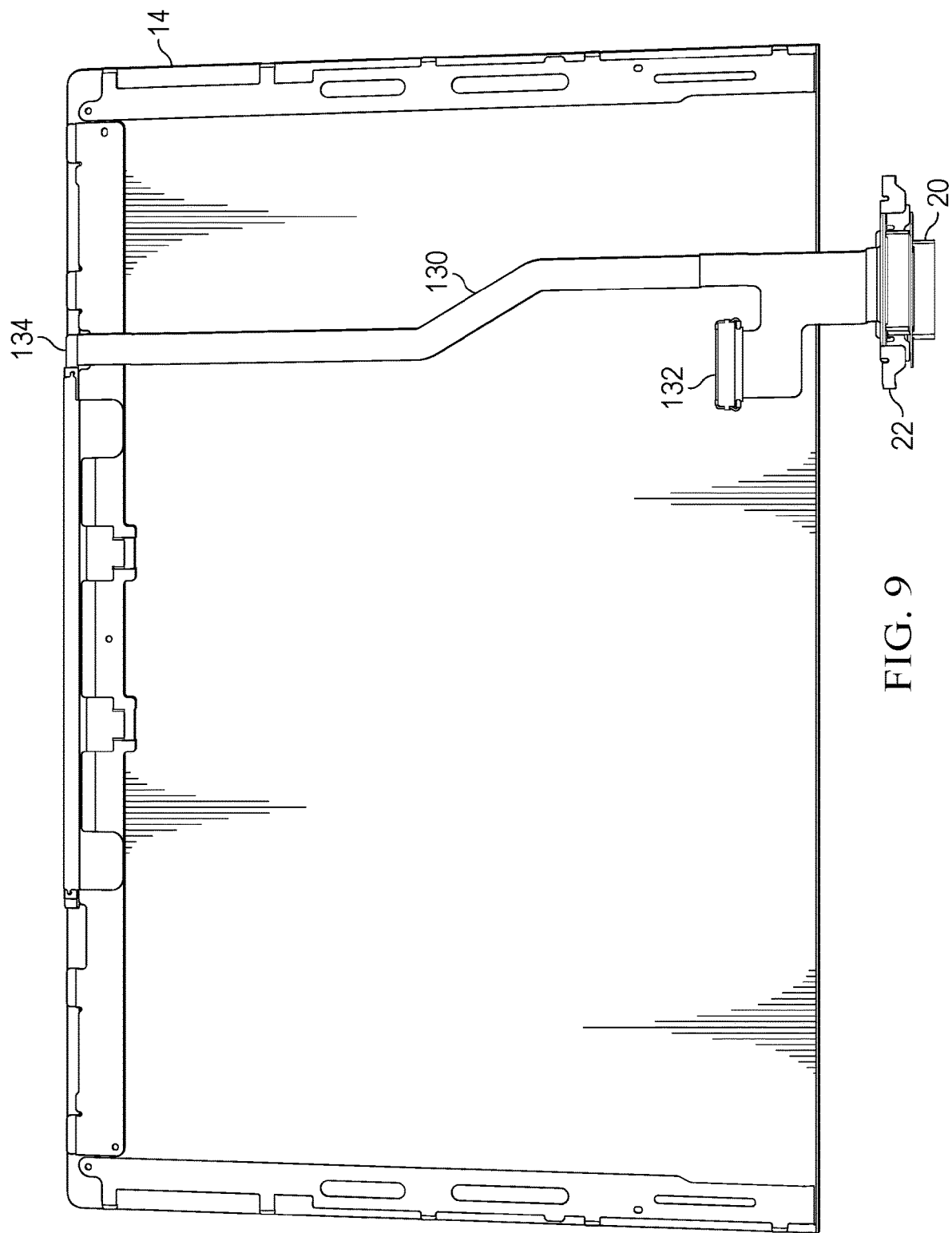
FIG. 9 depicts an example embodiment of an information handling system lid housing portion having a hinge up cable interface to support a camera and sensors coupled to the lid housing portion.
Figure 10:
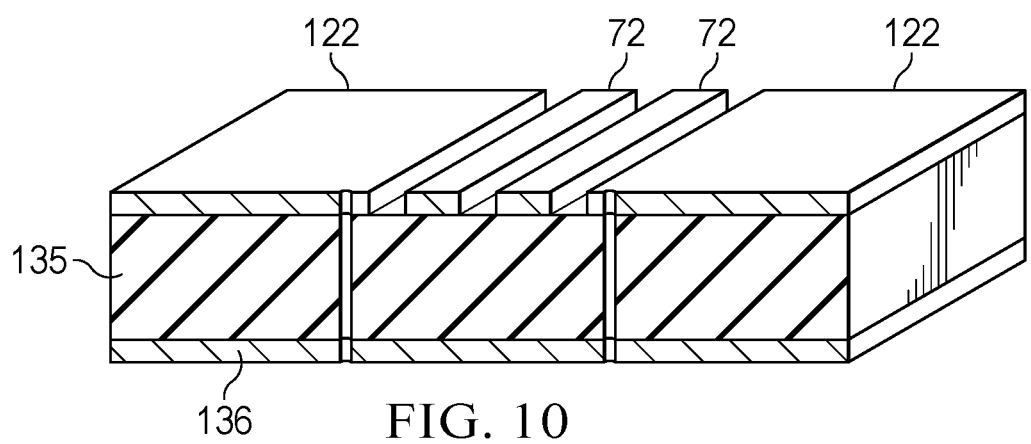
FIG. 10 depicts a side section view of a display substrate as an example embodiment having camera information communicated through traces formed in the display substrate.

Referring now to FIG. 5, a top view of an information handling system 10 depicts an alternative embodiment for communication between a motherboard and a port 76 at an I/O board on a side of the information handling system distal the motherboard. In the alternative embodiment, rather than establishing a communications link integrated in the keyboard membrane, a cable backplane 20 is routed through lid housing portion 14 and back to main housing portion 12 at the location of port 76. A communications hub on the motherboard and an I/O circuit board of the port manages communication across the lid communications link in a manner similar to that described with respect to the membrane communications link. Port 76 couples to a circuit board that supports communication with various interfaces, such as are detailed below with respect to FIG. 6, and the circuit board has an edge card to fit into the edge card connector held in place by snap in cable retainer 22 as described in FIGS. 1-3. In one embodiment, a portion of cable backplane 20 is used to support a communication link to the port while another portion separates from the horizontal path to pass vertically to a display connector so that both display information and port information are transferred through the same cable backplane. The lid housing portion may include a communications hub to coordinate information transfer, such as with a repeater function. As is described below in greater detail, other devices in the lid housing portion may be supported by communication through the communication link, such as for cameras and sensors, and the communication link may be established in part with traces integrated in the display, such as shown in FIGS. 9 and 10.

Figure 6:
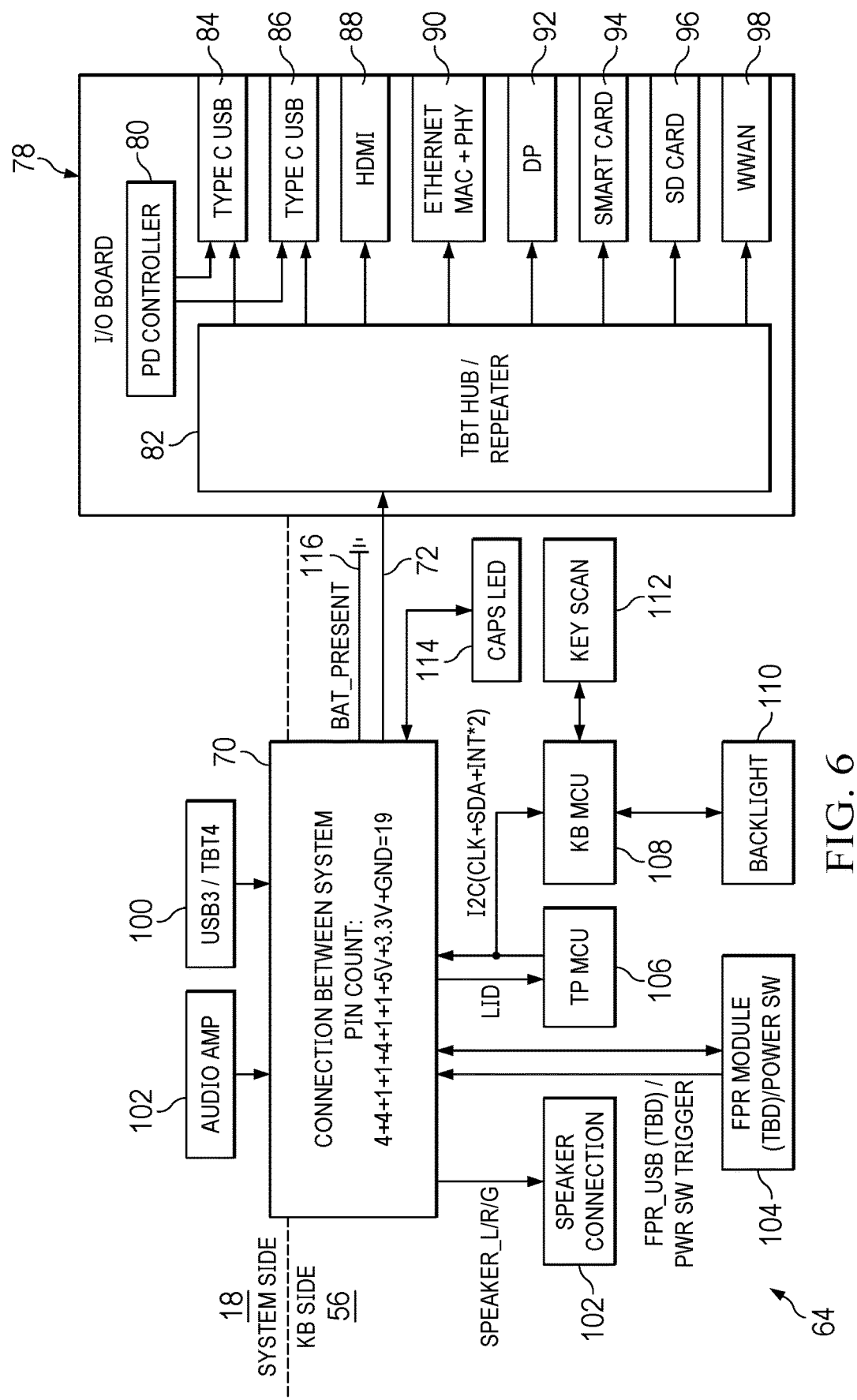
FIG. 6 depicts a circuit block diagram of a port input/output (I/O) board that supports plural ports through a communication link with a motherboard that is included in a keyboard membrane as described by FIG. 4 or a hinge up lid housing portion route as described by FIG. 5.

Referring now to FIG. 6, a circuit block diagram depicts a port input/output circuit board 78 that supports plural ports through a communication link 72 with a motherboard 18 that is included in a keyboard membrane 56 as described by FIG. 4 or a hinge up lid housing portion route as described by FIG. 5. Motherboard 18 interfaces with the keyboard membrane 56 through a spring biased connector 70, such as pogo pins and opposing pads, to communicate an audio signal from an audio amp 102 and a communication link signal from a communications hub 100, such as a USB 3 or Thunderbolt 4 hub. In the example embodiment, the communication link formatted information is directed from the spring biased pins through communication link 72 and then to a communications hub 82 of I/O circuit board 78, where the communications hub coordinates transfer of information to desired ports. Other pins of the spring biased connectors 70 support keyboard and peripheral functions. A power module 104 provides power to support USB power transfer when triggered by an appropriate software logic. A touchpad MCU 106 has a processing resource and instructions stored in non-transitory memory to operate a touchpad included in the keyboard membrane. A keyboard MCU 108 has a processing resource and non-transitory memory to detect and report key inputs from a key scan matrix 112 interfaced with the keyboard membrane sensors and also logic to manage backlights 110 of the keyboard. A caps lock LED 114 is illuminated by current through a pin, such as from an embedded controller of the motherboard. A battery ground 116 provides a ground interface between the battery and motherboard that will disconnect if the keyboard is removed so that the battery disconnects. Although the example embodiments show communications link hubs on the motherboard and I/O circuit board, in an alternative embodiment, another communication link may be added to the membrane to consolidate key inputs to the motherboard through the communication link with fewer spring biased contacts.

In the example embodiment, I/O board 78 supports bi-directional information transfer through communications link 72 between motherboard 18 and plural ports of different types. The example embodiment includes Type C USB ports 84 and 86, HDMI port 88, Ethernet port 90, a DisplayPort port 92, a smart card port and/or edge connector 94, an SD card connector 96 and a wireless wide area network (WWAN) 98 radio to communicate wireless signals. A power controller 80 manages power transfer to and from ports that support power features, such as the Type C USB ports. Other types of ports may be included based upon the desire for support of the ports distal the motherboard. In various embodiments, a separate power port may be included and supported by a power line through the keyboard membrane in addition to the communications link. In one embodiment, such as where thermal constraints might call for distribution of heat generating components away from the motherboard, the components may be separately supported by the communications link, such as a PCIe or similar interface, or may be supported by including more than one communications link. The use of spring biased connectors and pads to support the interface offers a convenient assembly option to reduce the need for cables in the system, however, other types of interfaces may be used.

Figure 7:
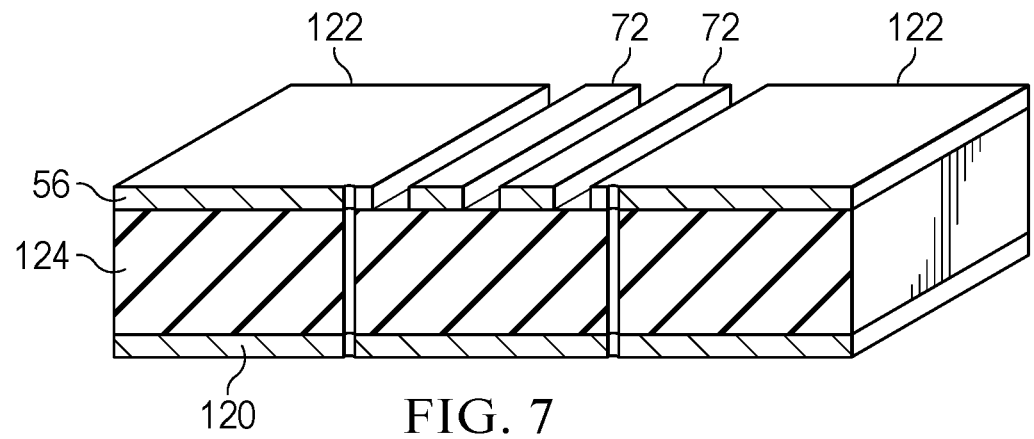
FIG. 7 depicts a side cross sectional view of a keyboard membrane backlight section as an example configuration of a communications link having a coplanar waveguide configuration.

Referring now to FIG. 7, a side cross sectional view of a keyboard membrane 56 backlight section depicts an example configuration of a communications link 72 have a coplanar waveguide configuration. A ground plane 122 is deposited on the backlight portion dielectric 124 on both sides of the coplanar waveguide configuration and interfaced through the dielectric by a via to a base ground plane 120. The ground plane dielectric is placed around the communication link to help ensure good signal transfer with reduced interference from others system signals. The membrane dielectric is a flexible printed circuit used in keyboard membranes and the traces may be silver. Alternatively, other types of dielectric substrate may be used, such as hard circuit board. The backlight portion of membrane 56 may be separate from the key matrix portion or included with the key matrix portion.

Figure 8:
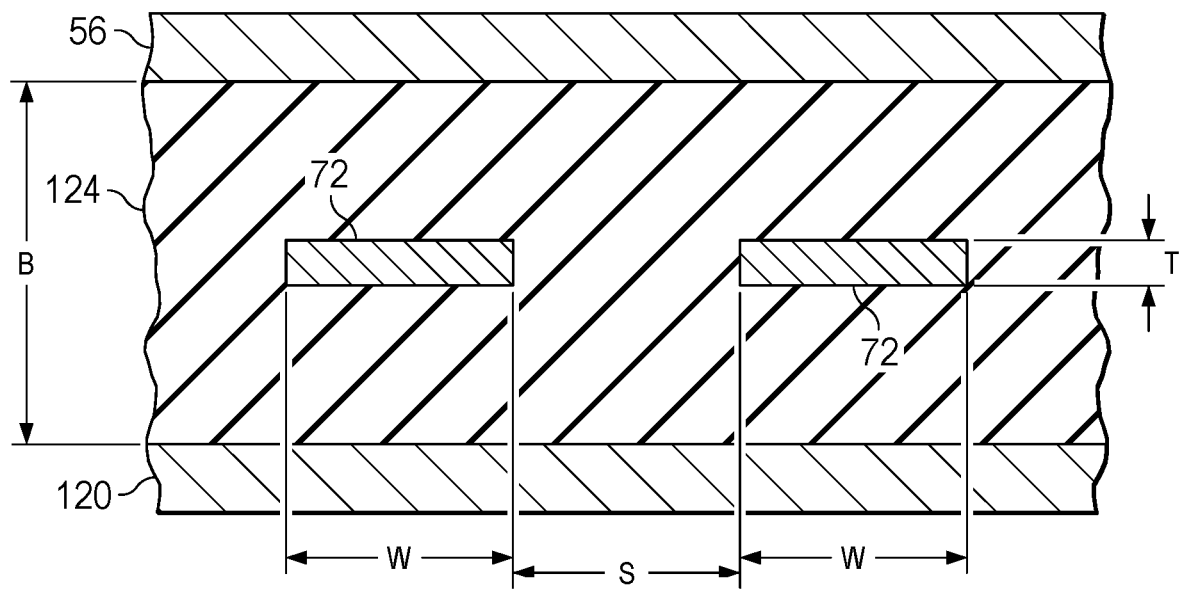
FIG. 8 depicts a side cross sectional view of a keyboard membrane as an example configuration of a communications link having a differential strip line configuration.

Referring now to FIG. 8, a side cross sectional view of a keyboard membrane 56 depicts an example configuration of a communications link 72 having a differential strip line configuration. In the example embodiment, conductive wirelines are formed within the keyboard membrane dielectric 124 with a ground above and below the wirelines to block interference. In one example embodiment, the ground on the lower side of keyboard membrane 56 may be the support plate disposed under the keyboard membrane and punched from a conductive material, such as steel. In one embodiment, keyboard membrane 56 has layers that include different ground, matrix, communication link and/or backlight portions.

Referring now to FIG. 9, an example embodiment depicts an information handling system lid housing portion 14 having a hinge up cable interface to support a camera 134 and sensors coupled to the lid housing portion. In the example embodiment, a cable backplane 20 interfaces with components of the main housing portion, such as an edge card slot extending from a motherboard or an I/O circuit board as described above, and is held in position with a snap in cable retainer 22. A display connector 132 interfaces a first portion of the cable backplane with the display to communicate visual information for presentation as visual images at the display. A camera connector 130 interfaces a second portion of the cable backplane with camera 134 to provide communication between the motherboard and camera. The example embodiment illustrates dual support of graphics communication to a display, such as from a graphics processing unit (GPU) on the motherboard or the I/O circuit board, and camera communication to a main housing portion through a common cable backplane. In an alternative embodiment, high speed graphics and camera information are communicated to a single display connector and then controlled impedance traces included in the display substrate propagate the camera communication signals to the camera, such as to a spring biased connector arrangement that transfers the signals between the display substrate and camera. The display controlled impedance traces may include additional ground traces to shield the high speed signals. In addition, a shared ground, such as a copper ribbon, may be shared across the hinge up connector and between the motherboard, display connector and camera connector. In one example embodiment, camera and other sensor traces are formed in the display substrate at inactive display areas that do not have pixels to present visual images, such as around the lower portion of the display and along the periphery up to the camera connector. Alternatively, the camera wirelines may be formed in the display substrate at a different layer of thickness than the display pixel wirelines.

Referring now to FIG. 10, a side section view of a display substrate 135 depicts an example embodiment having camera information communicated through traces formed in the display substrate. In the example embodiment, a coplanar waveguide configuration is integrated into the display glass upper surface to form the communication link 72 between grounds 122. The grounds 122 shield the high speed link differential signals and couple through a via to an underlying ground layer 136, such as a frame of the display. In alternative embodiments, other types of configurations may be used, such as a differential strip line, with the wirelines included between display substrate materials and with various configurations of associated ground wires.

Figure 11:
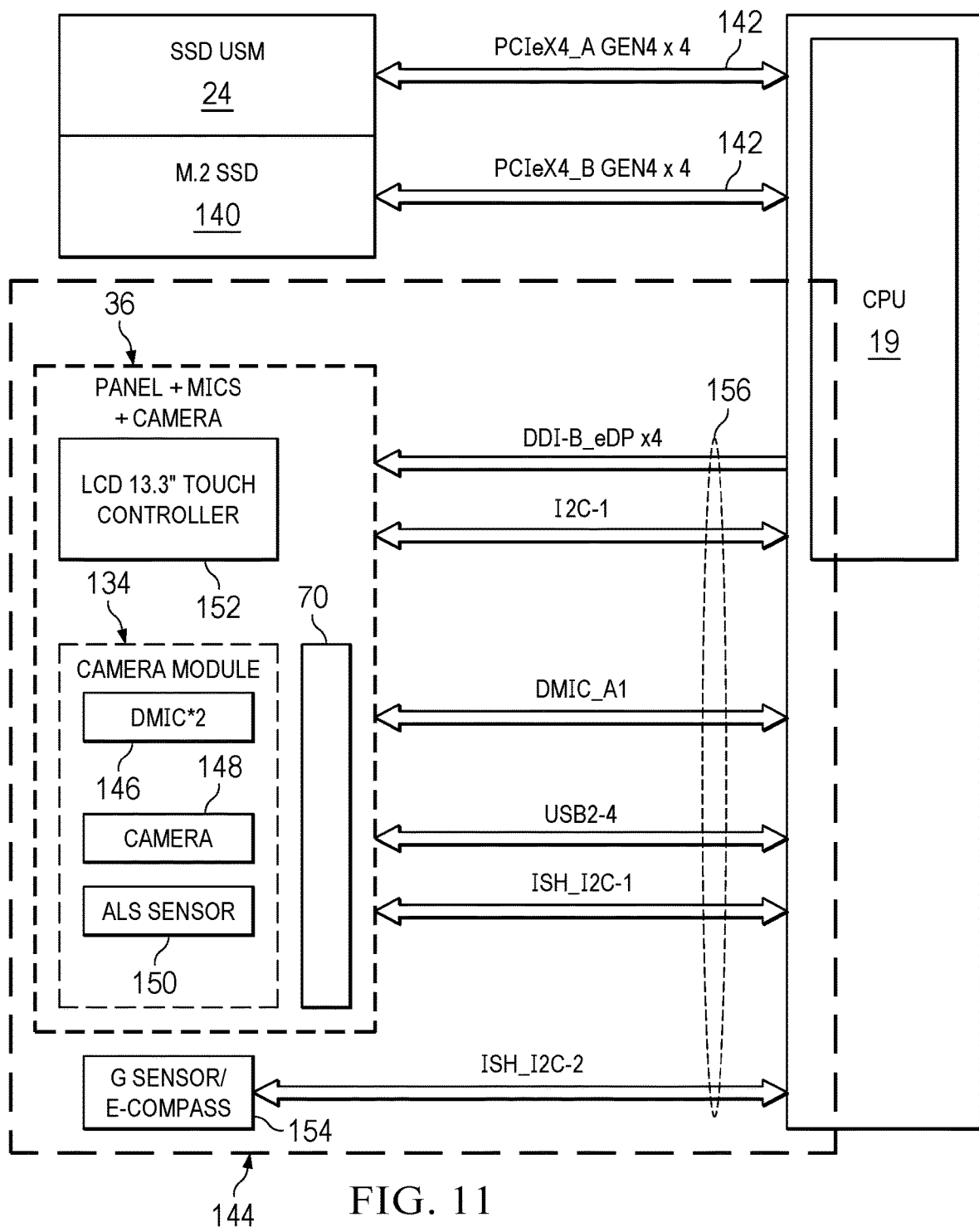
FIG. 11 depicts a circuit block diagram of an example embodiment of information communication through display substrate wirelines that define a high speed communication link.

Referring now to FIG. 11, a circuit block diagram depicts an example embodiment of information communication through display substrate wirelines that define a high speed communication link. In the example embodiment, CPU 19 generates visual information for presentation at a display 36 by executing instructions to process information, such as in cooperation with an SSD 24 acting as unified memory and SSD 140, both interfaced though a motherboard PCIe communications link 142. CPU 19 interfaces with a display assembly 144 through a communication link 156 supporting a plurality of differential serial links and a variety of communication protocols, such as a DDI eDP display interface, an I2C interface, a microphone interface, a USB interface and an ISH I2C sensor interface. Display assembly 144 has a display 36 with an LCD panel 152 that presents visual images, and a camera module 134 that includes a microphone 146 that captures audible sounds, a camera 148 that captures visual images and an ambient light sensor 150 that senses ambient light conditions. The example embodiment includes an accelerometer and E-compass 154 interfaced through an ISH I2C sensor interface. As described above with respect to FIG. 4, camera module 134 can include spring biased contacts 70, such as pogo pins, that press against contact pads formed in the display substrate to terminate communication link 156.

One difficulty that arises with the hinge up flexible backplane cable described above is that usage over time will tend to impact the integrity of the wirelines and contacts, resulting in decreased signal transfer effectiveness. In the example embodiment of FIG. 11, the eDP interface of communications link 156 is managed by logic within CPU 19 that includes link training to obtain optimal performance for a set of operating conditions, including deterioration in the cable and wirelines carrying the eDP link signals. When conditions result in excessive signal loss, the training can lower the link speed and adjust other factors to establish as robust a link as possible, or at least a minimum link quality. When an eDP link fails to train or fails in operation to cause re-training, the system performance can become unreliable. Processing resources of the CPU or other processing components of the information handling system manage link training by execution of instructions stored in non-transitory memory that perform link training and track link performance.

Figure 12:
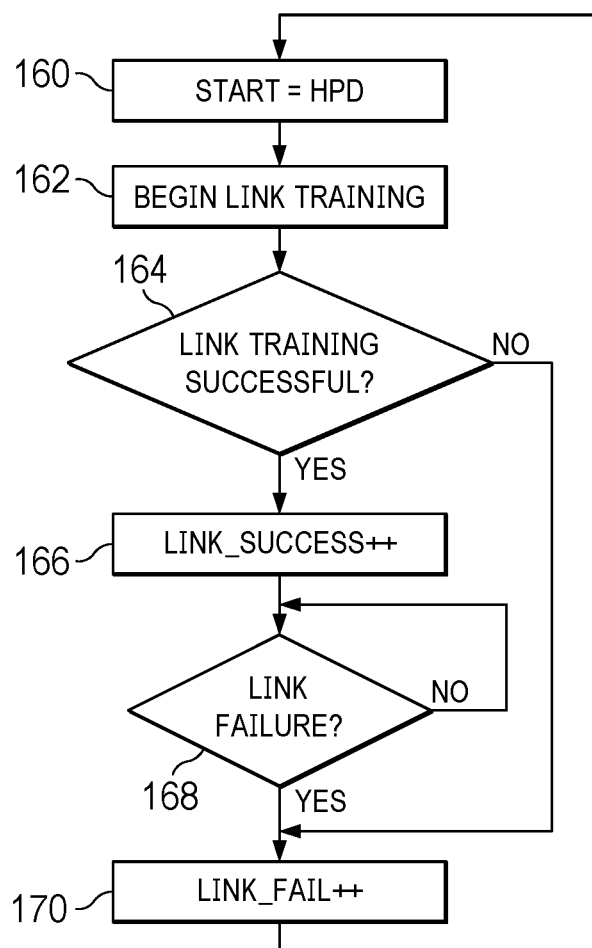
FIG. 12 depicts a flow diagram of an example of a communication link training performed at a processing resource to adapt link communication to link physical conditions.

Referring now to FIG. 12, a flow diagram depicts an example of a communication link training performed at a processing resource to adapt link communication to link physical conditions. The process starts at step 160 hot plug detection and starts link training at step 162. The link training is defined by various standards and includes an exchange of source and sink capabilities followed by defined link training sequences of information transfer on the link lanes to determine a speed of information transfer that achieves a desired accuracy for the link, such as at different link clock states. At step 164, a determination is made of whether the link training was successful, such as comparing the transferred information with received values. If the training is not successful, the process continues to step 170 to count the training as a failure and returns to step 160 to re-initiate training, such as at a slow clock speed. If the number of link failures at step 170 exceeds a threshold, such as more than 5, the link training fails and an error is issued. If at step 164 the link training is successful, a count is kept of the success at 166 and periodically a check is made at step 168 to determine if a link failure occurs during operational use of the link. If a failure is detected, the process continues to step 170 to track the failure and returns to step 160 to initiate a link training. During link training and operational use, the link status is tracked to include the parameters that are successful, the number of failures and the number of link training attempts, along with other factors. The link training tracking information is maintained over time and analyzed locally on the information handling system to determine link reliability and associated cable backplane status.

Figure 13:
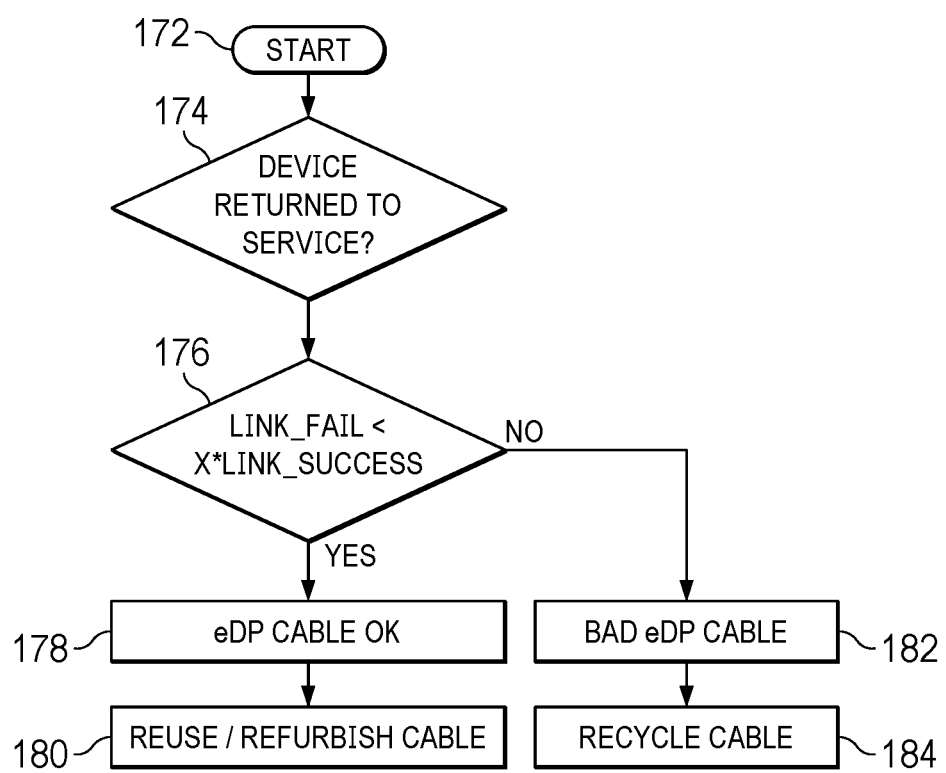
FIG. 13 depicts a flow diagram of a process for tracking eDP training to manage reuse and recycling of display cables.

Referring now to FIG. 13, a flow diagram depicts a process for tracking eDP training to manage reuse and recycling of display cables. The process executes on a CPU or other processing resource that manages display communication link training with instructions stored in non-transitory memory. Intelligent telemetry monitoring of link failure rates in the eDP display interface determines the display cable health. At initialization, the eDP link performs training to determine a best signal strength for a most reliable link connection. When a cable is faulty, physical characteristics of the communication link change over time and can lead to link failures in the display interface that can have a randomness associated with physical conditions of the communication link as the physical layer is changed over time, such as due to a change in housing rotational configuration or shocks related to movement. Accumulation of link failures in a display register tracks the cable health indirectly and can be queried as desired to evaluate cable interface quality. Storage of the link failure rate and frequency, as well as the training characteristics, such as link speed, provide insights into the eDP cable health that can be forwarded to a remanufacture location to evaluate return of the information handling system for reuse and recycling of the display cable before a failure occurs. Although the example embodiment relates to eDP communication links, similar training tracking may be used for other types of communication links that have a training process to manage communication link settings.

The process starts at step 172 with the communication link training and failure statistics stored in non-transitory memory, such as a display register or a telemetry database. At step 174 a determination is made that the information handling system is returned to a service location or otherwise being evaluated to determine display cable health. For example, the communication link training information may be remotely accessed to evaluate an operational system, automatically evaluated with on-board health monitoring instructions, or downloaded from the system when the system is returned for recycling or reuse. At step 176, the link failure results are evaluated against a failure threshold to measure the health of the display cable, such as by determining if the failure rate over a preceding time period is greater than a threshold. The evaluation may also consider other factors, such as the consistency of the link settings achieved over time. For instance, a communication link that trains to high and low speeds in a random manner may indicate a physical link instability, such as a cracked wireline. Similarly, a communication link that trains to a high speed in a consistent manner, has a failure, then trains to a slightly lower speed might indicate a healthy cable that can remain deployed with a slightly higher failure rate. At step 178, if the failure rate is less than the threshold, the communication link is evaluated as acceptable and at step 180 is reused and/or refurbished. This evaluation might also involve a relative quality rating so that cables with fewer failures will go to reuse in higher end systems that have greater display communication link demands. If the link failure rate exceeds the threshold the process continues to step 182 to evaluate the cable as bad and to step 184 to recycle the cable. In addition to the link training indication, the components involved in the display communication link may also have health evaluated by current and voltage use as described below.

Figure 14:
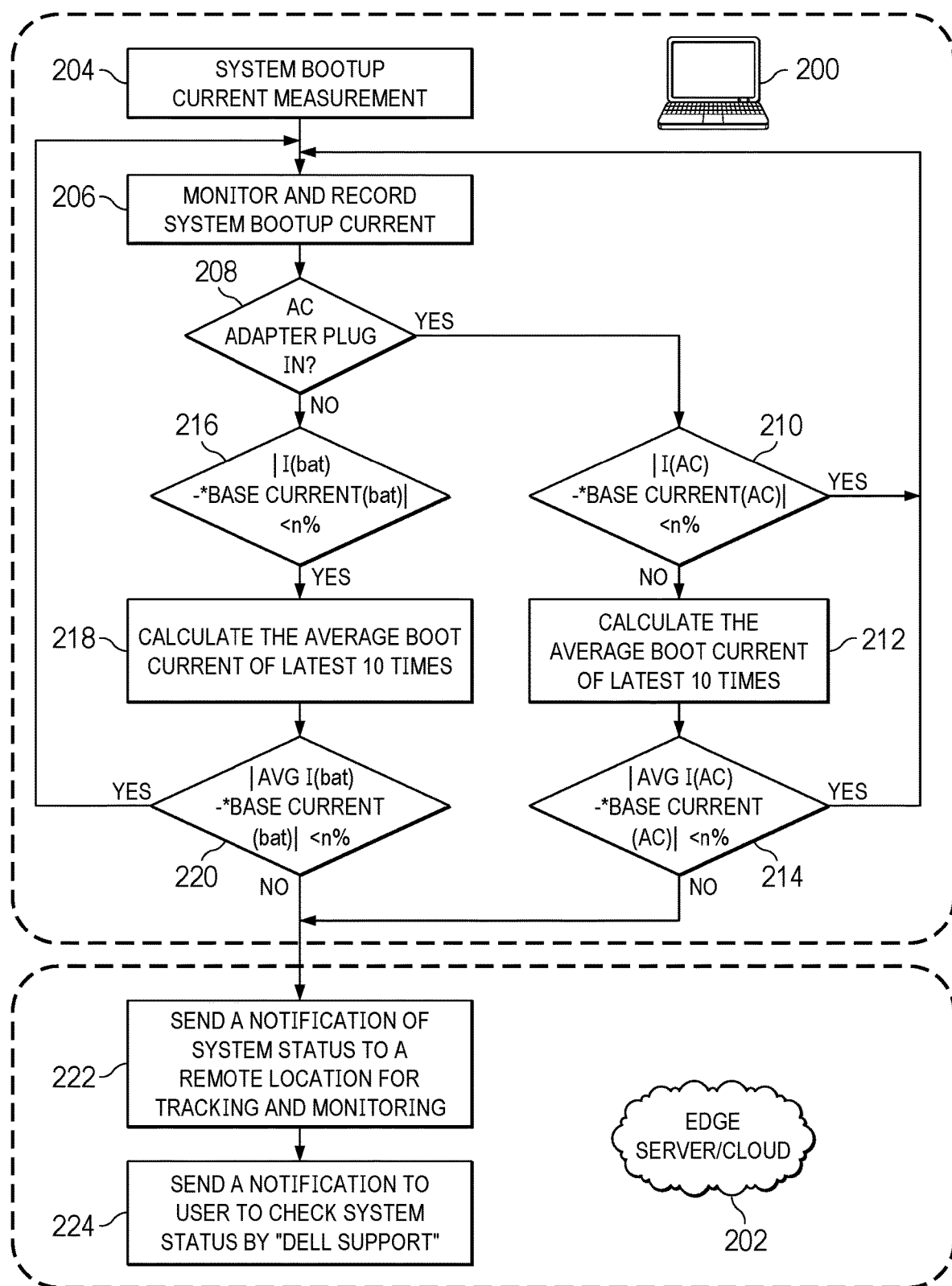
FIG. 14 depicts a flow diagram of a process for evaluating information handling system health based upon power usage telemetry changes over time.

Referring now to FIG. 14, a flow diagram depicts a process for evaluating information handling system health based upon power usage telemetry changes over time. The solution uses a current sensor to monitor and record information handling system power response at known events, such as AC_IN, BATT_IN, SYS_IN and CDECK_IN at system boot. A calculation of system power use at boot and the change is system power use for the known event over time supports a projection of system reliability and is stored for evaluation at system return to evaluate component reuse and recycling. The process executes on a processing resource of an information handling system 200, such as CPU running an application from non-transitory memory, and interacts with a network location, such as an edge server information handling system 202 in a cloud environment. The process starts at step 204 during information handling system boot so that initial power up provides a repeatable power transition state at which power use can be repeatably measured. At step 206, current use is measured at multiple components of the information handling system, such as those described below in FIG. 16. During system power up and boot, a determination is made at step 208 of whether the system's external AC power adapter is plugged in since the availability of external power may impact current use. If yes then at step 210, a determination is made of whether the amount of power use at system power up and boot minus the base power use measured at factory is greater than a threshold. If the power use is less than the threshold, the process returns to step 206 to continue monitoring power use at boot. If at step 210 the power use threshold is exceeded, the process continues to step 212 to calculate the power use with current draw during the previous 10 boots, although alternative embodiments may use different numbers of boots for the average value. At step 214, the average of power use over the previous 10 boots minus the base power use is compared against the threshold to determine if power use is excessive. If not, the process returns to step 206. If power use exceeds the threshold, the process continues to report the event to a cloud location as discussed in greater detail below.

If at step 208 external AC power is not available at power up, the process continues to step 216 to determine if the current use while booting on battery minus the factory measured battery current use at boot is less than a threshold. At step 218, an average of power use for the last 10 battery boots is determined. At step 220 a comparison is performed of the average current use for boot power up with the battery over the past 10 boots minus the factory current use on a battery boot. If the singular boot power use or the average power use at boot power up is greater than the threshold, the process continues to step 220 to report the power use aberration, otherwise the process returns to step 206 to continue monitoring power use at boot. When the threshold is exceeded at step 220, the process continues to step 222 to send a notification of the power use status to the network location and at step 224 a notification is provided to the end user to check with available support tools to analyze the system for any potential failures.

Figure 15:
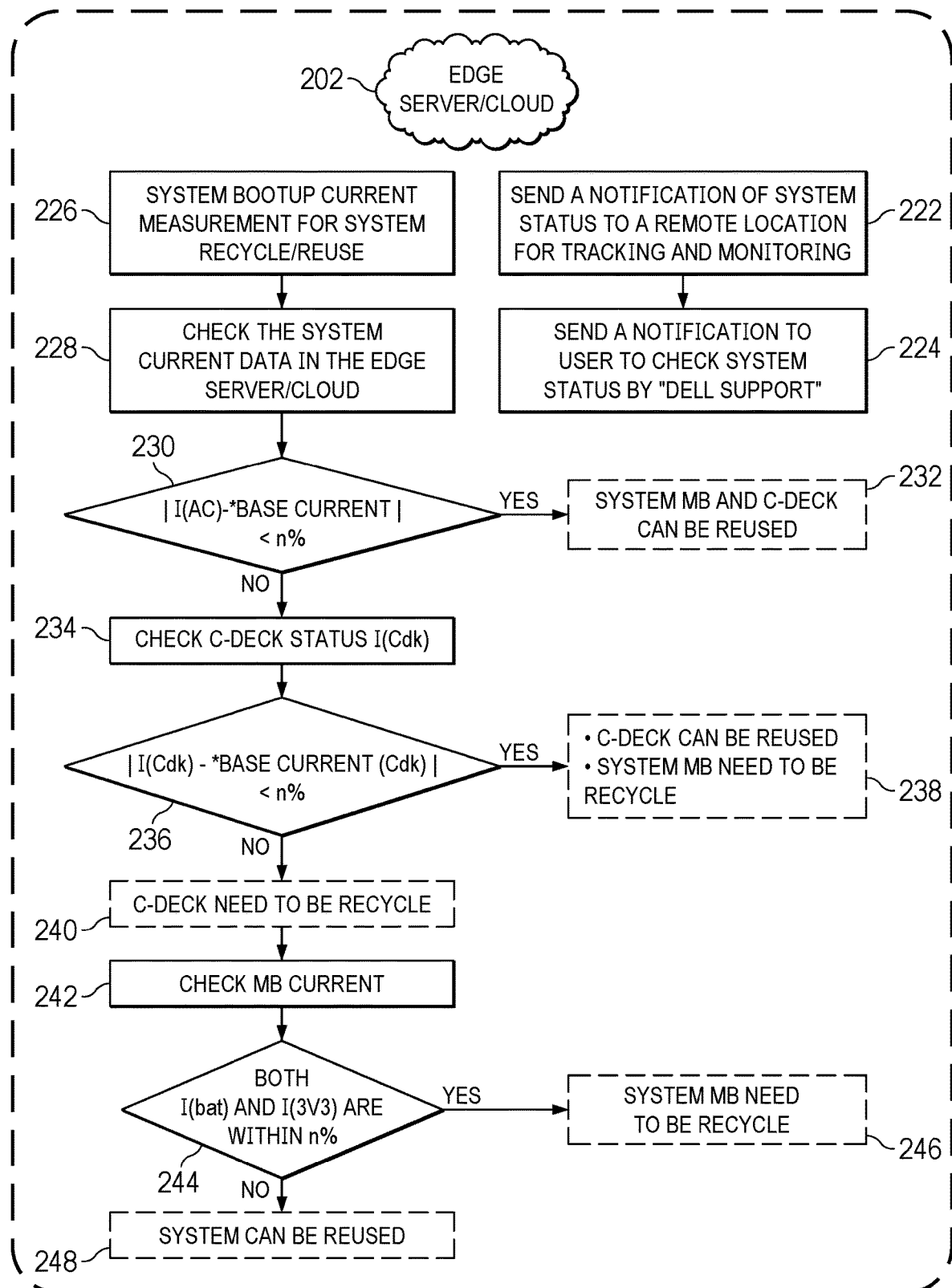
FIG. 15 depicts a flow diagram of a process for determining information handling system reuse and recycling dispositions based upon power usage telemetry.

Referring now to FIG. 15, a flow diagram depicts a process for determining information handling system reuse and recycling dispositions based upon power usage telemetry. Once the notification arrives at the network location at step 222 and a notification is sent to the end user at step 224, the process continues to step 226 to retrieve to the network location the boot up power use data from the information handling system. At step 228, historical power use data for the information handling system that is stored at the network location is retrieved. At step 230, a determination is made of whether the AC power supply current minus the base current is less than the threshold and, if so, the process continues to step 232 to conclude that the system motherboard and cover deck can be reused. If at step 230 the AC power use minus the base current is greater than the threshold, the process continues to step 234 to check on the cover deck status. At step 236 a determination is made of whether the cover deck power use minus a base power use of the cover deck from manufacture exceeds a threshold. If not, the process continues to step 238 to determine that the cover deck can be reused and the system motherboard should be recycled. If at step 236 the cover deck threshold is exceeded, the process continues to step 240 to recycle the cover deck. From step 240, the process continues to step 242 to check the motherboard current during system boot. At step 244, for the motherboard a battery and a 3.3V power supply current use is compared against a threshold. If at step 244 both have power use within the threshold, the process continues to step 246 to reuse the motherboard. If either the battery or the 3.3V power use exceeds the threshold, the process continues to step 248 to recycle the motherboard rather than reuse the motherboard.

Figure 16:
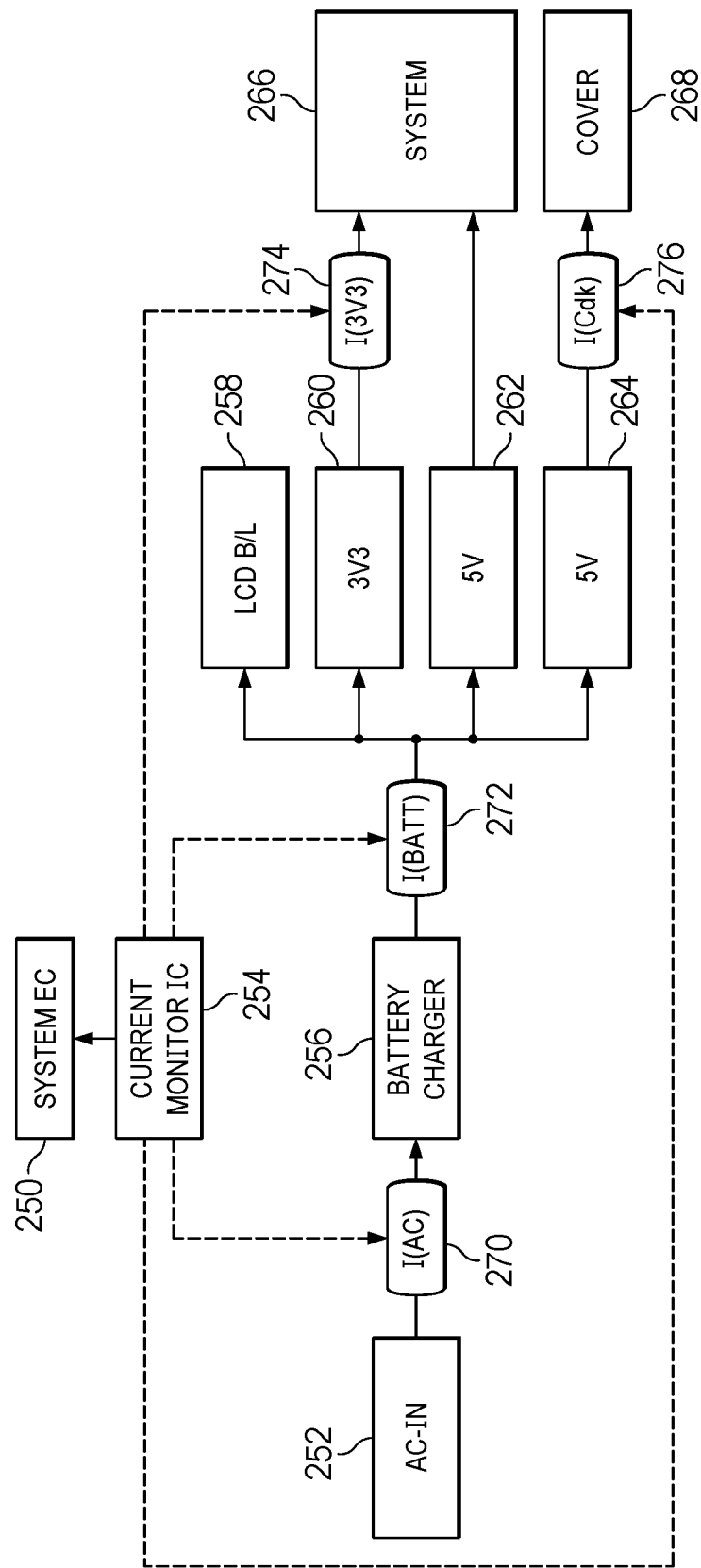
FIG. 16 depicts a block diagram of an example of a power system that monitors power use to determine information handling system health.

Referring now to FIG. 16, a block diagram depicts an example of a power system that monitors power use to determine information handling system health. In the example embodiment, an embedded controller 250 includes a processing resource and non-transitory memory that executes instructions to monitor power use, such as is described above in FIGS. 14 and 15. Embedded controller 250 interfaces with a current monitor 254 integrated circuit that monitors current passing through different current sensors. Alternating current power in (AC_IN) 252 provides external power through an AC current sensor 270, which measure the current passage from the external power source to a battery charger 256. Battery charger 256 provides current VBatt through a battery current sensor 272. At a system level, power is provided to and LCD backlight 258, to a 3V power source 260, to a 5V power source 262 and a cover deck 5V power source 264. In the example embodiment, current use is measured by a 3V current sensor 274 that passes to the system motherboard 266. Current is also measured to the cover deck 268 by a cover deck current sensor 276. The cover deck is, for instance, the housing portion and related components that fit over the main housing portion, such as the keyboard, I/O board, speakers, etc.

In operation, a power use monitor running on the embedded controller initiates power use monitoring at a first event, such as execution of preboot code, and completes power use monitoring at a second event, such as handoff of the boot process from the system BIOS to the operating system. By initiating power use monitoring at a defined event and completing power use monitoring at a defined event, power use can be measured for the system as the events occur overtime. Execution of system boot provides a consistent reference point as the system hardware executes and self-checks since the preboot and BIOS code do not change very often. Embedded controller 250 stores the power use data and reports when an anomaly in power use is detected that could indicate a hardware or other type of failure is developing. As is described in FIG. 15, the location of the power use anomaly is isolated by checking each current sensor in turn until the smallest zone of excessive power use is isolated. Generally, the power use comparison described above measures the amount of current that each voltage bus transfers for the event. To achieve an accurate comparison, the current measured may include a maximum current for the event, a current measured for a time period of the event and/or other types of measurements that provide an accurate comparison for the event power use at a different occurrences of the event. For example, rather than starting and stopping power measurement with a first and second command in boot code, a current may be measured at one or more single time points in the boot code, such as measuring current at start of preboot code then measuring current at handoff of the system BIOS to the operating system. As another example, power may be measured during system POST, such as at each power on test command for the components of the information handling system. In another example embodiment, the comparison of measured currents may include a comparison of the difference at each of plural locations at predetermined instance to detect any of the current sensor having a high value relative to a normal difference from other current sensors.

Although the present invention has been described in detail, it should be understood that various changes, substitutions and alterations can be made hereto without departing from the spirit and scope of the invention as defined by the appended claims.

What is claimed is:

1. An information handling system comprising:
a housing having a main portion rotationally coupled by a hinge to a lid portion;
a motherboard coupled to the main portion and having an edge card extending from one side;
a processor coupled to the motherboard and operable to execute instructions that process information;
a memory coupled to the motherboard and operable to store the instructions and information, the memory interfaced with the processor through the motherboard;
a display coupled to the housing lid portion and operable to present the information as visual images;
a flexible cable terminating at a first end with an edge card connector that removably couples to the edge card and at a second end with the display;
a cable retainer separate from the edge card and configured to fit around the edge card connector and snap couple to the main housing portion aligned with the edge card, the cable retainer having a brace portion that fits around the edge card connector, a securing portion that extends under the motherboard, a vertical member extending up from the securing member and a dimple formed in the vertical member aligned to snap engage a dimple cavity formed in the housing main portion.

2. The information handling system of claim 1 wherein the card connector is an M.2 card connector.

3. The information handling system of claim 1 further comprising:
a camera coupled to the housing lid and operable to capture visual images;
wherein the flexible cable terminates at a second end with communication from the camera of the information.

4. The information handling system of claim 1 further comprising:
a cable port at a side surface of the housing main portion;
wherein the flexible cable extends across the housing lid portion to terminate at a second end with communication to the cable port.

5. The information handling system of claim 4 wherein the cable port comprises a display port having information for presentation at a display.

6. The information handling system of claim 4 wherein the cable port comprises a USB Type C port.

7. A method for communicating information from an information handling system motherboard, the method comprising:
mounting an edge card on a side of the motherboard;
snapping an edge card connector to a side of a main housing portion of the information handling system with a cable retainer that fits around the edge card connector;
sliding the motherboard over top a portion of the cable retainer and against the side of the main housing portion to engage the edge card into the edge card connector;
forming a dimple cavity in the main housing portion; and
engaging a dimple of a cable connector coupled to the edge card connector in the dimple cavity;
communicating information from the motherboard through the edge card, the edge card connector and a flexible cable to a display coupled in a lid housing portion of the information handling system;
presenting the information as visual images at the display;
communicating the information through the flexible cable in the lid housing portion; and
interfacing the flexible cable with a port coupled to the main housing portion.

8. The method of claim 7 further comprising:
capturing visual image information with a camera coupled to the lid housing portion; and
communicating the visual image information from the camera to the motherboard.

9. A system for communicating information from an information handling system main housing portion to a lid housing portion:
a motherboard having an edge card extending from a side;
a flexible cable terminating at a first end with an edge card connector that removably couples to the edge card and at a second end with communication to a display of the information;
a cable retainer separate from the edge card and configured to fit around the edge card connector and snap couple to the main housing portion aligned with the edge card;
a brace portion that fits around the edge card connector;
a securing member that extends under the motherboard;
a vertical member extending up from the securing member; and
a dimple formed in the vertical member and aligned to snap engage a dimple cavity formed in the housing main portion.

* * * * *